United States Patent
Huang et al.

(10) Patent No.: US 11,776,647 B2
(45) Date of Patent: *Oct. 3, 2023

(54) MEMORY REPAIR USING OPTIMIZED REDUNDANCY UTILIZATION

(71) Applicant: Taiwan Semiconductor Manufacturing Company Limited, Hsinchu (TW)

(72) Inventors: Chien-Hao Huang, Hsinchu (TW); Cheng-Yi Wu, Taichung (TW); Katherine H. Chiang, New Taipei (TW); Chung-Te Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/982,512

(22) Filed: Nov. 7, 2022

(65) Prior Publication Data

US 2023/0066482 A1  Mar. 2, 2023

Related U.S. Application Data

(63) Continuation of application No. 17/356,647, filed on Jun. 24, 2021, now Pat. No. 11,495,314.

(Continued)

(51) Int. Cl.
*G11C 29/10* (2006.01)
*G11C 29/44* (2006.01)
(Continued)

(52) U.S. Cl.
CPC ............ *G11C 29/10* (2013.01); *G11C 29/18* (2013.01); *G11C 29/36* (2013.01);
(Continued)

(58) Field of Classification Search
CPC ......... G11C 29/10; G11C 29/18; G11C 29/36; G11C 29/4401; G11C 29/787; G11C 2029/1202; G11C 2029/3602
See application file for complete search history.

(56) References Cited

U.S. PATENT DOCUMENTS 6,967,878 B2 * 11/2005 Dono ................... G11C 29/785
                                                         365/201
9,202,593 B1    12/2015 Magia et al.
(Continued)

FOREIGN PATENT DOCUMENTS

KR    20010082668 A    8/2001
KR    20150029839 A    3/2015
(Continued)

OTHER PUBLICATIONS

Office Action received from the Korean Patent Office in related patent Application No. 10-2021-0102112 dated Dec. 8, 2022; 5 pages.

(Continued)

*Primary Examiner* — Mohammed A Bashar
(74) *Attorney, Agent, or Firm* — The Marbury Law Group, PLLC

(57) ABSTRACT

A semiconductor device is provided, which contains a memory bank including M primary word lines and R replacement word lines, a row/column decoder, and an array of redundancy fuse elements. A sorted primary failed bit count list is generated in a descending order for the bit fail counts per word line. A sorted replacement failed bit count list is generated in an ascending order of the M primary word lines in an ascending order. The primary word lines are replaced with the replacement word lines from top to bottom on the lists until a primary failed bit count equals a replacement failed bit count or until all of the replacement word lines are used up. Optionally, the sorted primary failed bit (Continued)

count list may be re-sorted in an ascending or descending order of the word line address prior to the replacement process.

20 Claims, 9 Drawing Sheets

Related U.S. Application Data

(60) Provisional application No. 63/135,072, filed on Jan. 8, 2021.

(51) Int. Cl.
*G11C 29/18* (2006.01)
*G11C 29/00* (2006.01)
*G11C 29/36* (2006.01)
*G11C 29/12* (2006.01)

(52) U.S. Cl.
CPC ........ *G11C 29/4401* (2013.01); *G11C 29/787* (2013.01); *G11C 2029/1202* (2013.01); *G11C 2029/3602* (2013.01)

(56) References Cited

U.S. PATENT DOCUMENTS

| | | |
|---|---|---|
| 19,449,694 | 9/2016 | Paudel et al. |
| 2003/0179641 A1 | 9/2003 | Terzioglu et al. |
| 2007/0195618 A1 | 8/2007 | Krech, Jr. et al. |
| 2011/0113280 A1 | 5/2011 | Chickanosky et al. |
| 2016/0351276 A1* | 12/2016 | Shim ................. G11C 29/76 |
| 2019/0237154 A1 | 8/2019 | Choi |

FOREIGN PATENT DOCUMENTS

| | | |
|---|---|---|
| KR | 20170034177 A | 3/2017 |
| KR | 10-2019-0093358 A | 8/2019 |
| KR | 20200019463 A | 2/2020 |
| TW | 201503145 B | 1/2015 |
| TW | I604452 B | 11/2017 |

OTHER PUBLICATIONS

Taiwan Patent Office; Application No. 111100012, Notice of Allowance dated Jul. 14, 2022; 3 pages.
Notice of Allowance received from the Korean Patent Office in related patent Application No. 10-2021-0102112 dated Jun. 20, 2023, 8 pages.

* cited by examiner

| | |
|---|---|
| Sorted primary failed bit count list | Tabulates addresses and bit fail counts per word line of the M primary word lines in a descending order for the bit fail counts per word line |
| Sorted replacement failed bit count list | Tabulates addresses and bit fail counts per word line of the R replacement word lines in an ascending order for the bit fail counts per word line |
| Re-sorted primary failed bit count list | Is modified from the primary failed bit count list by re-sorting a topmost subset containing the total replacement count number of listings of the primary word lines in an order of ascending addresses or descending addresses |

FIG. 9

MEMORY REPAIR USING OPTIMIZED REDUNDANCY UTILIZATION

RELATED APPLICATIONS

This application is a continuation application of U.S. application Ser. No. 17/356,647 filed on Jun. 24, 2021, which claims the benefit of priority from U.S. Provisional Application No. 63/135,072 titled "Memory Repair with Redundancy Utility Optimization" filed on Jan. 8, 2021, the entire contents of both of which are hereby incorporated by reference for all purposes.

BACKGROUND

Despite best efforts, many memory dies are manufactured with defective memory cells. Such memory dies may be "repaired" into operational memory dies by utilizing redundancy cells. For example, word lines connected to at least one defective memory cell may be logically replaced with a redundancy word line connected to a row of redundancy memory cells. A memory die that includes defective memory cells distributed over more word lines than the total number of redundancy word lines may not be repaired, and thus, may have to be discarded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a table that tabulates various failed bit count lists that may be generated and employed during use of the methods of embodiments of the present disclosure.

DETAILED DESCRIPTION

Figure 1:
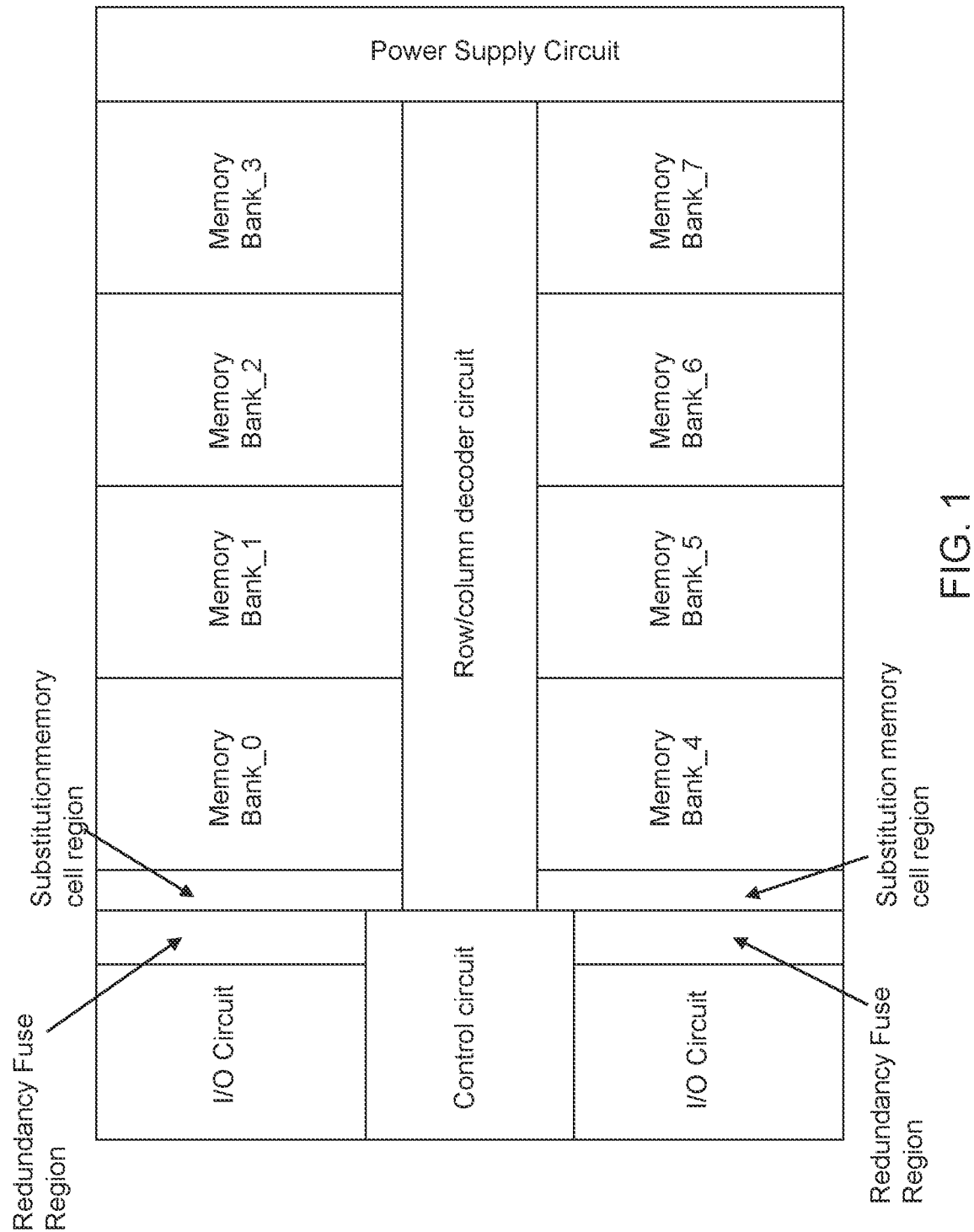
FIG. 1 is a component block diagram of an exemplary random access memory die according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a component block diagram of an exemplary random access memory die according to an embodiment of the present disclosure is illustrated. The random access memory die comprises a plurality of random access memory cells, i.e., memory cells that may be randomly accessed upon designation of a set of logical addresses such as a combination of a word line address and a bit line address. For example, the random access memory die may comprise an array of dynamic random access memory cells including a respective series connection of an access transistor and a capacitor. One node of the capacitor may be connected to a source region of the access transistor, and the gate electrode of the access transistor may be a portion of a word line that may be activated by a word line control transistor. The drain region of the access transistor may be connected to a respective bit line through a drain connection structure such as a drain contact via structure. Generally, each random access memory cell may be provided in an array environment within a respective memory bank.

The exemplary random access memory die includes eight memory banks, which are labeled as "Memory bank_i" in which the integer i runs from 0 to 7. Generally, a random access memory die according to embodiments of the present disclosure includes at least one memory bank. Each memory bank includes a two-dimensional array of memory cells that may be accessed by a respective set of word lines and a respective set of bit lines. Each word line includes gate electrodes for a row of access transistors that may be laterally spaced apart along a first horizontal direction, and each bit line may be connected to a respective set of drain regions located within a respective column of access transistors that are arranged along a second horizontal direction, which may be perpendicular to the first horizontal direction. While the present disclosure is described employing an embodiment in which a random access memory die includes eight memory banks, embodiments are expressly contemplated herein in which a different number of memory backs is present within a random access memory die.

The random access memory die may comprise a row/column decoder circuit, which is a circuit that decodes the word line addresses and bit line addresses during operation of the random access memory die. A word line corresponding to the decoded word line address may be activated by the row/column decoder circuit, and a set of bit lines within the memory bank that includes the address of the selected bit line may be activated by the row/column decoder circuit. Generally, the row/column decoder circuit activates at least one word line and a set of bit lines that are associated with the a selected address or a selected address range during operation of the random access memory die.

The random access memory die may comprise a control circuit that controls various operations within the random access memory die. The various operations include programming operations (i.e., write operations), erase operations, and read operations.

The random access memory die may comprise at least one input/output circuit, which controls data flow into, and out of, the random access memory die. Latches and data buffers may be provided within the at least one input/output circuit.

The random access memory die may comprise a power supply circuit configured to provide power supply voltages to the memory banks and various other circuits within the random access memory die. Various other peripheral circuits (not illustrated) such as clock circuits, signal buffers, and signal amplifiers may be provided within the random access memory die as needed.

According to an aspect of the present disclosure, the random access memory die may comprise at least one redundancy fuse region including redundancy fuse elements, which may include first redundancy fuse elements and second redundancy fuse elements. The first redundancy fuse elements may comprise programmable read only memory (PROM) elements such as electrically programmable fuses. The first redundancy fuse elements may be configured to re-configure electrical connection between the row-column decoder circuit and word lines within the memory banks. For example, if a set of defective primary word lines in a memory bank are logically replaced with a set of replacement word lines, the first redundancy fuse elements are configured to activate a respective one of the replacement word line when a word line address corresponding to one of the defective word lines is decoded by the row/column decoder circuit. In one embodiment, each first redundancy fuse element may be employed to logically replace a defective primary word line with a respective one of the replacement word lines.

According to an aspect of the present disclosure, substitution memory cells may be provided in a memory bank, which may be employed to logically replace individual memory bits that may remain in any of the memory banks after replacement of defective primary word lines with replacement word lines. In one embodiment, each second redundancy fuse element may be employed to logically replace a defective memory cell with a respective one of the substitution memory cells, i.e., with a single substitution memory cell configured to store a single data bit.

Figure 2:
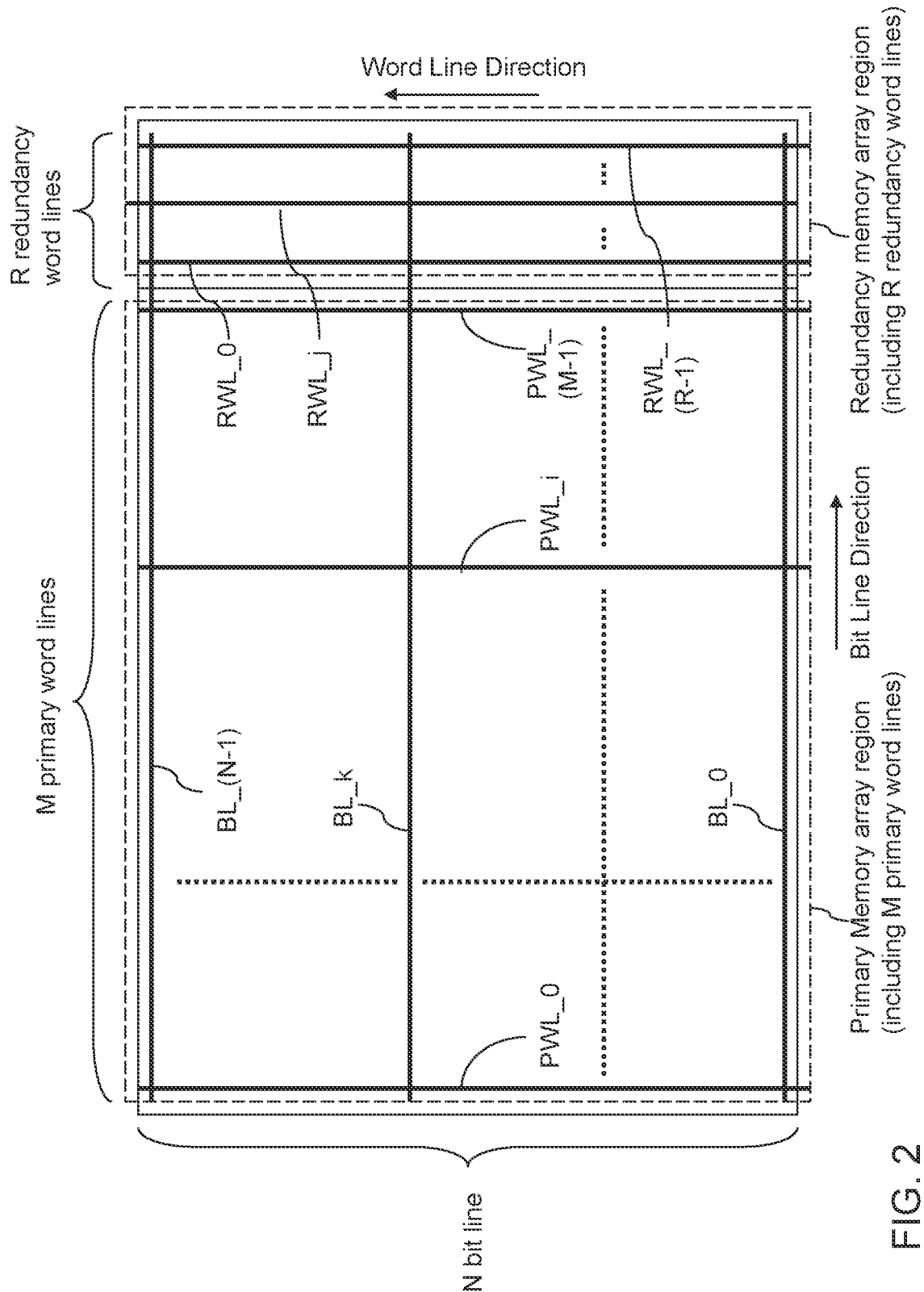
FIG. 2 is a magnified view of a memory bank within the exemplary random access memory die of FIG. 1 according to an embodiment of the present disclosure.

FIG. 2 is a magnified view of a memory bank within the exemplary random access memory die of FIG. 1 according to an embodiment of the present disclosure. The memory bank illustrated in FIG. 2 may be any one of the memory banks (e.g., Memory bank_0 through Memory bank_7) in FIG. 1. According to an embodiment of the present disclosure, the memory bank may comprise a primary memory array region and a redundancy memory array region. In one embodiment, the primary array region comprises M×N primary memory cells connected to M primary word lines and N bit lines, and the redundancy memory array region comprises R×N redundancy memory cells connected to R replacement word lines and the N bit lines. In one embodiment, the integer M may be a number that is an integer power of 2, i.e., $2^k$ in which k may be in a range from 8 to 20. The integer N may, or may not, be a number that is an integer power of 2, i.e., $2^l$ in which l may be in a range from 8 to 20. The integer R is generally less than M, and may be in a range from 0.1% to 10%, such as from 0.2% to 5% of the number M.

The M×N primary memory cells may be located within a primary memory array region. The R×N redundancy memory cells may be located within a redundancy memory array region, which may be laterally offset from the primary memory array region along the direction of the bit lines. The primary word lines may be numerically numbered sequentially from one side to another with a numerical index that increases by 1 with each shift from one primary word line to another. For example, the primary word lines may be numerically numbered such that an (i+1)-th primary word line is labeled as PWL_i, in which the integer i changes from 0 to (M−1). The replacement word lines may be numerically numbered sequentially from one side to another with a numerical index that increases by 1 with each shift from one replacement word line to another. For example, the replacement word lines may be numerically numbered such that a (j+1)-th replacement word line is labeled as RWL_j, in which the integer j changes from 0 to (R−1). The bit lines may be perpendicular to the primary word lines and the replacement word lines. The bit lines may be numerically labeled sequentially from one side to another such that a (k+1)-th bit line is labeled as BL_k in which the integer k changes from 0 to (N−1).

Generally, each memory bank may be manufactured employing a sequence of semiconductor manufacturing processing steps. Testing of each random access memory die may be performed at a test step, which may be performed prior to dicing the random access memory dies within a wafer into a plurality of discrete random access memory dies. Failures in the functionality of each memory cell may be identified within each memory bank during a test step. A failure bit map of the array of the M×N primary memory cells and a failure bit map of the array of the R×N redundancy memory cells may be generated during the test step. A failure of a memory cell may include any deficiency in providing the functionality of the memory cell, and may include a failure in programming, a failure in erasing, or a failure in reading. Generally, any failure in randomly writing "1" or "0" and/or randomly reading a correct value for "1" or "0" may be considered a failure in the functionality of a memory cell.

Figure 3:
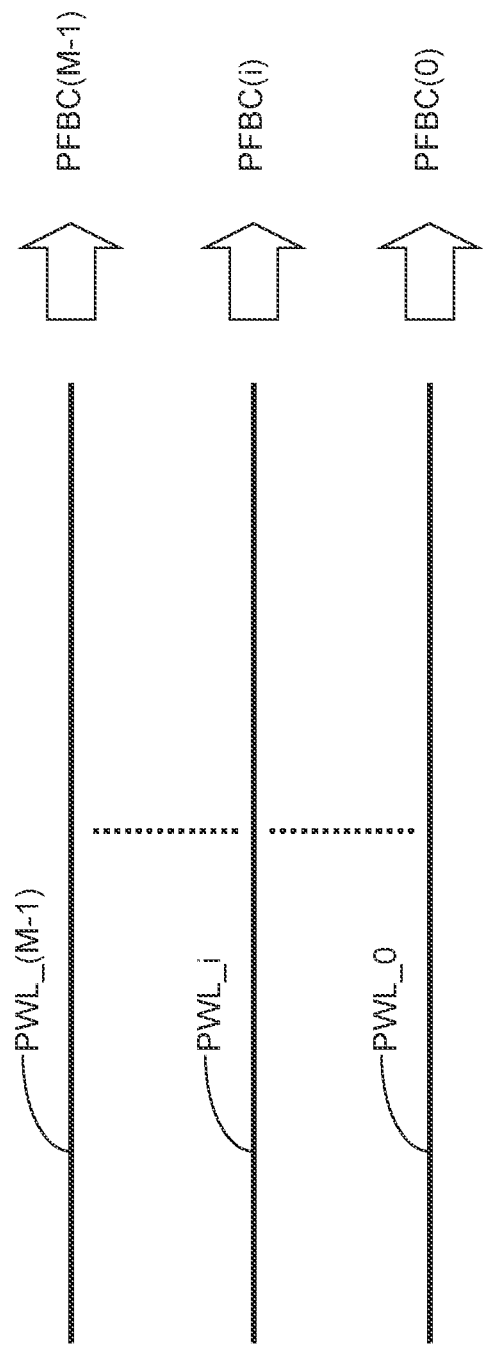
FIG. 3 schematically illustrates a process of determining a failed bit count per word line for each primary word line in a memory bank according to an embodiment of the present disclosure.

FIG. 3 schematically illustrates a process of determining a failed bit count per word line for each primary word line PWL_i in a memory bank according to an embodiment of the present disclosure. The failed bit count per word line for any given primary word line PWL_i may be determined by counting the total number of failed memory cells that are addressed by the primary word line PWL_i. For example, the total number of failed memory cells addressed by a first primary word line PWL_0 is a first primary failed bit count PFBC(0) for the first primary word line PWL_0. For each integer i between 0 and M (i.e., for each integer i ranging from 1 to (M−1)), the total number of failed memory cells addressed by a (i+1)-th primary word line PWL_i is an (i+1)-th primary failed bit count PFBC(i) for the (i+1)-th primary word line PWL_i. Generally, the failed bit count per word line for each primary word line PWL_i in a memory bank may be generated by counting the total number of failed memory cells (as identified in a testing step) that are addressed by the respective primary word line PWL_i.

Figure 4:
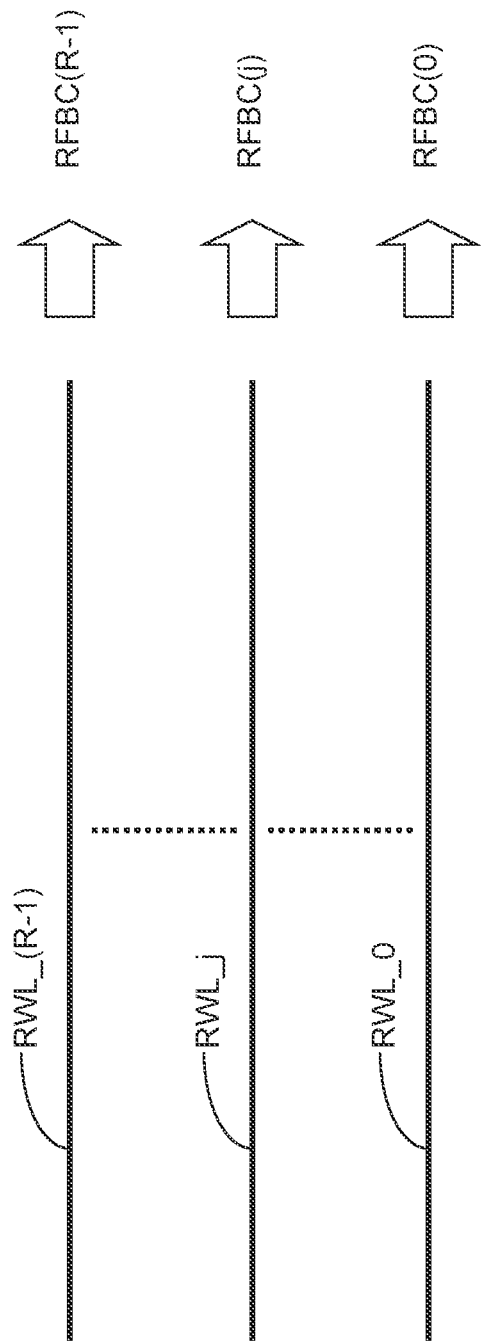
FIG. 4 schematically illustrates a process determining a failed bit count per word line for each replacement word line in a memory back according to an embodiment of the present disclosure.

FIG. 4 schematically illustrates a process of determining a failed bit count per word line for each redundancy word line RWL_j in a memory bank according to an embodiment of the present disclosure. The failed bit count per word line for any given redundancy word line RWL_j is determined by counting the total number of failed memory cells that are addressed by the redundancy word line RWL_j. For example, the total number of failed memory cells addressed by a first redundancy word line RWL_0 is a first redundancy failed bit count RFBC(0) for the first redundancy word line RWL_0. For each integer j between 0 and R (i.e., for each integer j ranging from 1 to (R−1)), the total number of failed memory cells addressed by a (j+1)-th redundancy word line RWL_j is a (j+1)-th redundancy failed bit count PFBC(j) for the (j+1)-th redundancy word line RWL_j. Generally, the failed bit count per word line for each redundancy word line RWL_j in a memory bank may be generated by counting the total number of failed memory cells (as identified in a testing step) that are addressed by the respective redundancy word line RWL_j.

Figure 5:
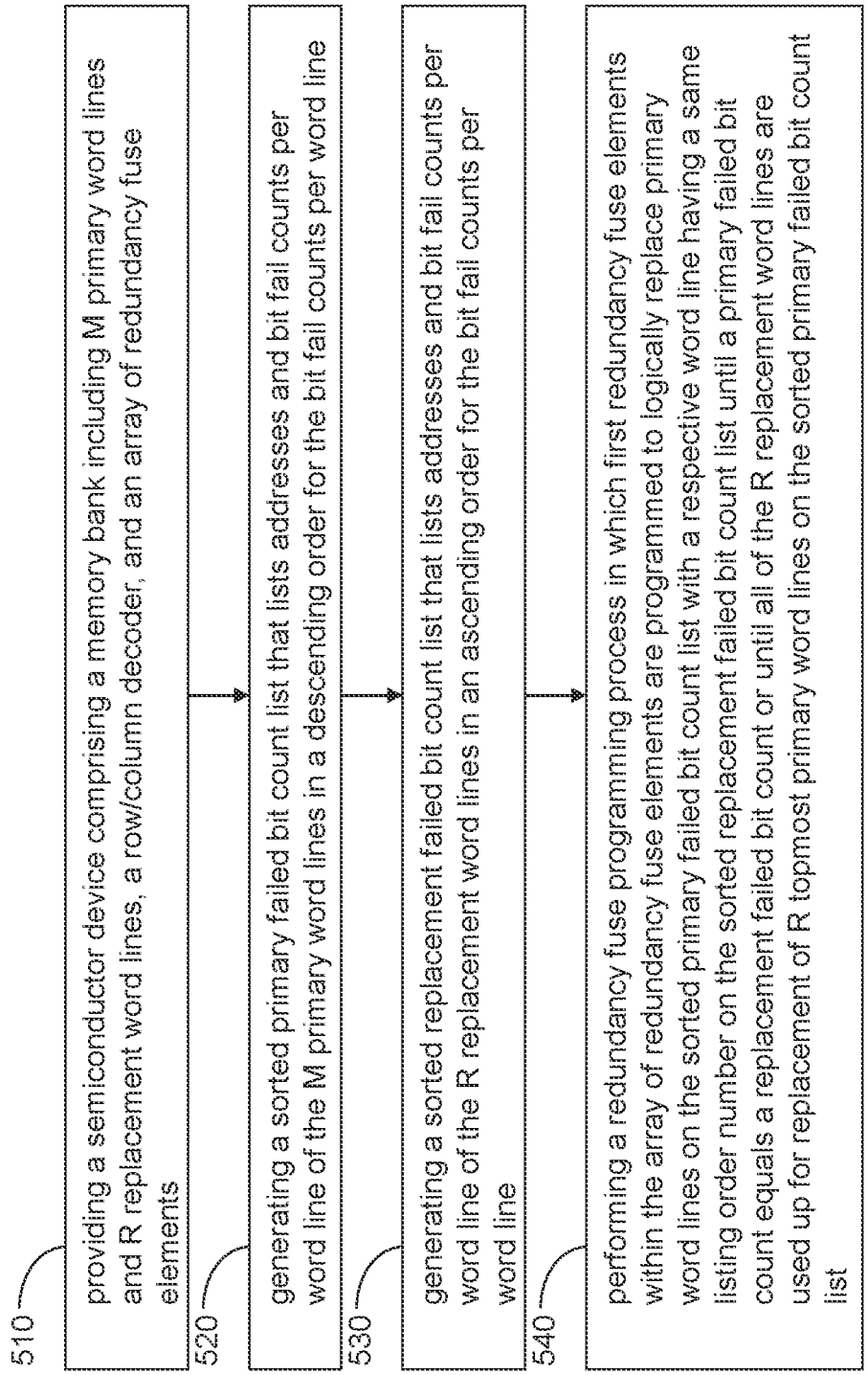
FIG. 5 is a first flowchart that illustrates a first exemplary sequence of processing steps for manufacturing a random access memory die of the present disclosure.

FIG. 5 is a first flowchart that illustrates a first exemplary sequence of processing steps for manufacturing a random access memory die of the present disclosure. FIG. 9 is a table that tabulates various failed bit count lists that may be generated and employed during use of the methods of embodiments of the present disclosure. Referring collectively to FIGS. 1-4 and step 510 of FIG. 5, a semiconductor device comprising a memory bank including M primary word lines and R replacement word lines, a row/column decoder, and an array of redundancy fuse elements may be provided.

Referring to step 520 of FIG. 5 and FIG. 9, a sorted primary failed bit count list may be generated for each memory bank, for example, by an automated program that runs on a tester or on a computing device in communication with the tester. The sorted primary failed bit count list tabulates addresses and bit fail counts per word line of the M primary word lines in a descending order for the bit fail counts per word line. Thus, the word line address of a primary word line having the highest bit fail count per word line is listed at the top of the sorted primary failed bit count list, and the word line address of a primary word line having a lowest bit fail count per word line (which is typically zero because a predominant fraction (i.e., more than 50%) of the primary word lines is fully functional) is listed at the bottom of the sorted primary failed bit count list. The total number of word line addresses associated with non-zero primary failed bit counts may, or may not, be greater than the total number R of replacement word lines in the memory bank.

In an illustrative example, the sorted primary failed bit count list may be generated by performing at least one write operation in which at least one test data pattern may be written in the primary memory array region of the memory bank. At least one read operation may be performed in which the at least one test data pattern is read from the primary memory array region. The number of memory bit fails per each primary word line may be determined based on changes in the at least one test data pattern between the at least one read operation and the at least one write operation. The addresses of the primary word lines may be sorted such that associated numbers of memory bit fails per each primary word line is in a descending order.

Referring to step 530 of FIG. 5 and FIG. 9, a sorted replacement failed bit count list may be generated for each memory bank, for example, by an automated program that runs on a tester or on a computing device in communication with the tester. The sorted replacement failed bit count list tabulates addresses and bit fail counts per word line of the R replacement word lines in an ascending order for the bit fail counts per word line. Thus, the word line address of a replacement word line having the lowest bit fail count per word line (which is typically zero because a predominant fraction (i.e., more than 50%) of the replacement word lines is fully functional) is listed at the top of the sorted replacement failed bit count list, and the word line address of a word line having a highest bit fail count per word line is listed at the bottom of the sorted replacement failed bit count list.

In an illustrative example, the sorted replacement failed bit count list may be generated by performing at least one write operation in which at least one test data pattern is written in the replacement memory array in the memory bank. At least one read operation may be performed in which the at least one test data pattern is read from the replacement array. The number of memory bit fails per each replacement word line may be determined based on changes in the at least one test data pattern between the at least one read operation and the at least one write operation. The addresses of the replacement word lines may be sorted such that associated numbers of memory bit fails per each replacement word line is in an ascending order.

Referring to step 540 of FIG. 5, a redundancy fuse programming process may be performed. The redundancy fuse programming process may be a part of a testing step, in which the deficiency in the functionality of a memory die under testing is repaired through activation of replacement word lines and through activation of substitution memory cells in the substitution memory cell regions.

Specifically, first redundancy fuse elements within the array of redundancy fuse elements may be programmed to logically replace primary word lines on the sorted primary failed bit count list with a respective word line having a same listing order number on the sorted replacement failed bit count list. This process starts with the topmost rows of the sorted primary failed bit count list and the sorted replacement failed bit count list row by row, i.e., line by line. In one embodiment, the row number (i.e., the listing order number) of each replacement word line that logically replaces a defective primary word line within the sorted replacement failed bit count list may be the same as the row number (i.e., the listing order number) of the defective primary word line within the sorted primary failed bit count list that is replaced by the respective replacement word line. This process may continue until a primary failed bit count equals a replacement failed bit count or until all of the R replacement word lines are used up for replacement of R topmost primary word lines on the sorted primary failed bit count list. In instances in which the primary failed bit count equals the replacement failed bit count, this number is referred to as a threshold number for bit fail count per word line.

For example, if the total number of fully functional replacement word lines (i.e., without any failed memory bit addressed by a respective primary word line) is R' (which is not greater than R), and if the total number of primary word lines with non-zero failed bit counts is not greater than R', each primary word line with a non-zero failed bit count may be logically replaced with a respective fully functional replacement word line employing the first redundancy fuse elements.

If the total number of fully functional replacement word lines (i.e., without any failed memory bit addressed by a respective primary word line) is R' (which is not greater than R), and if the total number of primary word lines with non-zero failed bit counts is greater than R', R' primary word line with a non-zero failed bit count may be logically replaced with a respective one of the R' fully functional replacement word lines employing the first redundancy fuse elements. Further, additional primary word lines with a non-zero failed bit count may be logically replaced with a respective one of the additional replacement word lines even if the additional replacement word lines have a non-zero failed bit count in the order of the listing order number (i.e., the row number) in the sorted primary failed bit count list until all of the R replacement word lines are used up for replacement of R topmost primary word lines on the sorted primary failed bit count list, or until a primary failed bit count equals a replacement failed bit count for a same listing order number (i.e., for a same row number), i.e., until "the threshold number for bit fail count per word line" is reached.

In one embodiment, the failed bit count of the R-th primary word line on the sorted primary failed bit count list may be greater than the failed bit count of the R-th replacement word line on the sorted replacement failed bit count list. In this embodiment, all of the R replacement word lines may be employed to replace the topmost R primary word lines on the sorted primary failed bit count list.

In another embodiment, the failed bit count of the R-th primary word line on the sorted primary failed bit count list may be equal to, or less than, the failed bit count of the R-th replacement word line on the sorted replacement failed bit count list. In this embodiment, the logical replacement process may terminate when a listing order number (i.e., a row number) is reached at which the failed bit count of a corresponding primary word line on the sorted primary failed bit count list equals the failed bit count of the corresponding replacement word line on the sorted replacement failed bit count list. In this embodiment, one or more of the replacement word lines are not employed to replace any primary word lines.

According to an embodiment of the present disclosure, the primary word lines on the sorted primary failed bit count list are sequentially replaced, from top to bottom, with the respective word line having the same listing order number (i.e., the same row number) on the sorted replacement failed bit count list.

According to an embodiment of the present disclosure, at least one unrepaired defective memory cell may be present within the memory bank after to logically replacing a subset of the primary word lines on the sorted primary failed bit count list with a respective word line having a same listing order number on the sorted replacement failed bit count list. In this embodiment, each of the R redundancy word lines is either used to replace a respective one of the defective primary word lines (i.e., primary word lines attached to at least one failed memory cell), or has the same number defective memory cells as, or has a greater number of defective memory cells than, any of the remaining unreplaced defective primary word lines.

Figure 6:
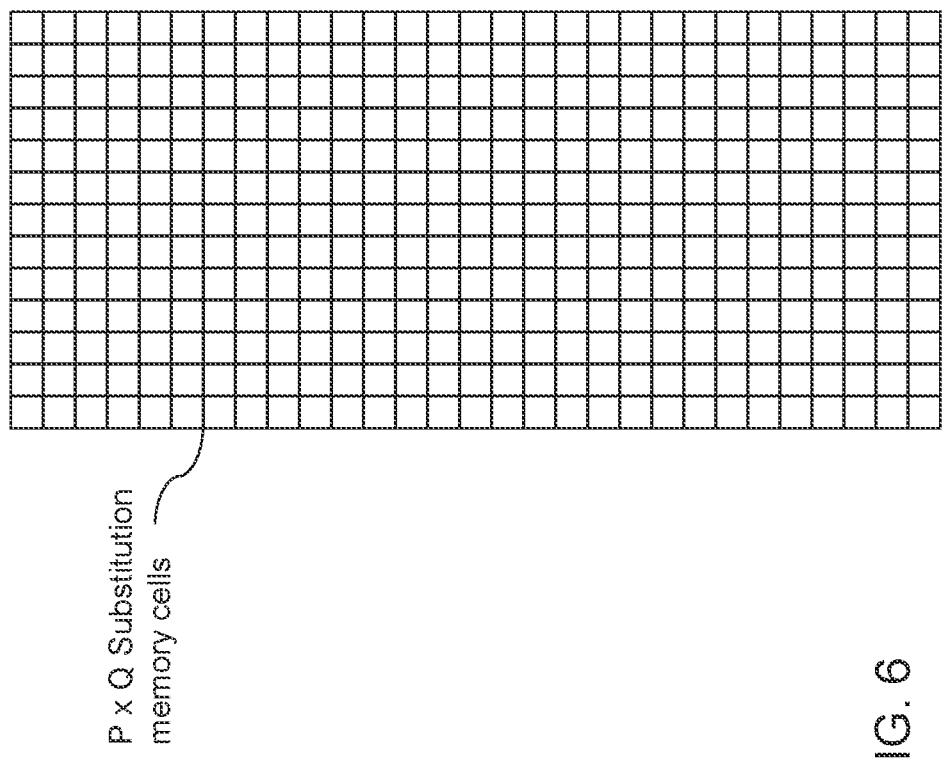
FIG. 6 is a magnified view of bit-level substitution memory cells within the exemplary random access memory die of FIG. 1 according to an embodiment of the present disclosure.

According to an aspect of the present disclosure and referring collective to FIGS. 1 and 6, the random access memory device may comprise substitution memory cells located in at least one substitution memory cell region. Each group of substitution memory cells may be located within a substitution memory bit array that is configured to be accessed individually by a respective pair of access lines, such as a pair of a substitution word line and a substitution bit line. In this embodiment, the second redundancy fuse elements within the array of redundancy fuse elements (located within the redundancy fuse region) may be programmed such that programmed second redundancy fuse elements logically replace, with a respective one of the substitution memory cells, each failed memory bit that is located within the primary memory array region and connected to a respective primary word line that is not logically replaced with a respective replacement word line. In one embodiment, the substitution memory cells may be arranged as a periodic array such as a P×Q rectangular array.

Thus, each failed bit within the M×N array of memory cells within the memory array area may be repaired either with a memory bit connected to a respective one of the replacement word lines or with a memory bit located within the substitution memory cells. In one embodiment, a set of N memory cells attached to each replacement word line is accessed simultaneously, and each substitution memory cell that replaces a failed memory bit within the M×N array of memory cells is addressed individually. The combination of the row/column decoder circuit and the redundancy fuse elements within the redundancy fuse region re-route address election signals from the controller to the redundancy word lines and to the substitution memory cells.

In one embodiment, each pair of access lines for accessing the substitution memory cells may be configured to access only a single substitution memory cell among the substitution memory cells, and may be electrically isolated from all other substitution memory cells. In one embodiment, the substitution memory cells may comprise an array of static random access memory cells comprising a respective set of at least six field effect transistors.

In one embodiment, the second redundancy fuse elements may be programmed such that the control circuit (which is connected to the second redundancy fuse elements and controls data flow based on the configuration of the second redundancy fuse elements) re-routes data for each failed memory bit that is replaced with a respective one of the substitution memory cells to the respective one of the substitution memory cells during a programming operation. Further, the second redundancy fuse elements may be programmed such that the control circuit (which is connected to the second redundancy fuse elements and controls data flow based on the configuration of the second redundancy fuse elements) re-routes an erase signal for each failed memory bit that is replaced with a respective one of the substitution memory cells to the respective one of the substitution memory cells during an erase operation. The control circuit may overwrite data for each failed memory bit that is replaced with a respective one of the substitution memory cells with data that is read from respective one of the substitution memory cells during a read operation. Thus, a read operation from the memory array area and the redundancy cell area may be performed simultaneously with a read operation from a respective set of at least one substitution memory cell, and may be followed by an overwrite operation in which data from the at least one substitution memory cell overwrites data from defective memory cells within the memory array area (including the M×N array of memory cells) that are logically replaced with a respective substitution memory cell.

Figure 7:
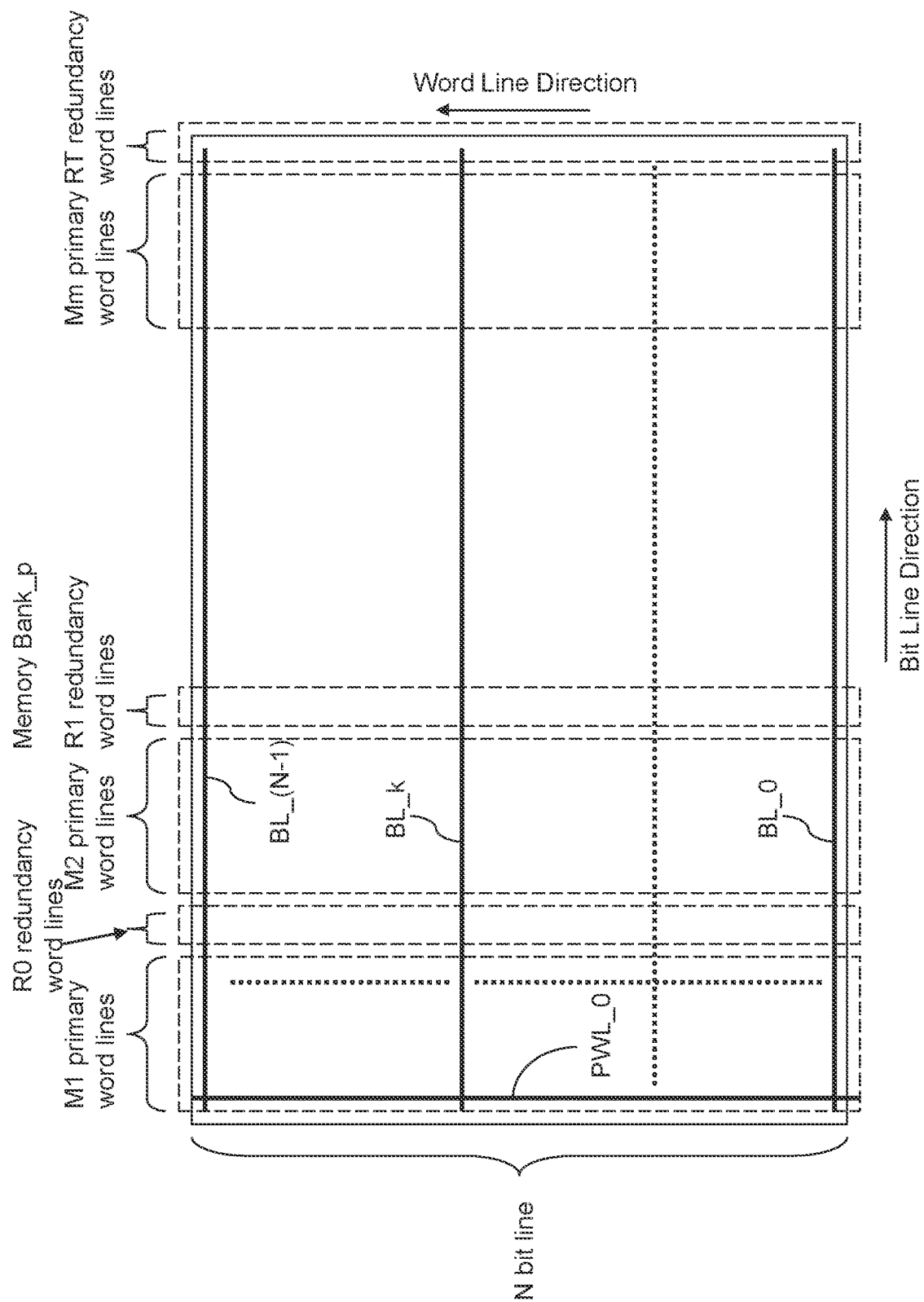
FIG. 7 is a magnified view of an alternative configuration of a memory bank within the exemplary random access memory die of FIG. 1 according to an embodiment of the present disclosure.

FIG. 7 is a magnified view of an alternative configuration of a memory bank within the exemplary random access memory die of FIG. 1 according to an embodiment of the present disclosure. In the alternative configuration of the memory bank, the R replacement word lines are located in at least two redundancy memory cell regions that are laterally spaced apart from each other or among one another by at least a subset of the M primary word lines. In other words, the R×N array of replacement memory cells may be divided into multiple $R_s \times N$ arrays of replacement memory cells, in which the index s runs from 0 to an integer T that is at least one. The integer T may be in a range from 1 to 127, and is equal to the total number of the multiple arrays of replacement memory cells. The sum of all values for $R_s$ over the index s ranging from 0 to T is equal to R.

In one embodiment, the random access memory device comprises a dynamic random access memory device in which each memory bit within the memory bank comprises a respective series connection of a capacitor structure configured to store electrical charges therein and an access transistor configured to control flow of electrical charges into, and out of, the capacitor.

Generally, the primary word lines may be formed within a single memory array containing an M×N array of memory cells or may be formed within at least two memory arrays containing a respective $M_t \times N$ array of memory cells such that the sum of all $M_t$'s equals M. The total number of memory arrays may be in a range from 1 to 128, although a greater number may be used. Further, the redundancy word lines may be formed within a single redundancy memory cell region or within at least two redundancy memory cell regions containing a respective $R_s \times N$ arrays of replacement memory cells such that the sum of all values for $R_s$ over the index s ranging from 0 to T is equal to R. The total number of redundancy memory cell regions may be in a range from 1 to 128, although a greater number may be used. In embodiments in which multiple memory array regions and/or multiple redundancy memory cell regions, such multiple memory array regions and/or multiple redundancy memory cell regions may be laterally spaced apart from one another along the bit line direction, and may be interlaced with one another along the bit line direction. In other words, instances of the memory array regions and/or instances of the redundancy memory cell regions may alternate along the bit line direction. The bit lines may continuously extend through each of the memory array region(s) and the redundancy memory cell region(s). For example, in an embodiment, a single memory array containing an M×N array of memory cells may be formed within a single redundancy memory cell region. In another embodiment, a single memory array containing an M×N array of memory cells may be formed within at least two redundancy memory cell regions containing a respective $R_s \times N$ arrays of replacement memory cells such that the sum of all values for $R_s$ over the index s ranging from 0 to T is equal to R. In such an embodiment, the at least two redundancy memory cell regions may be formed before and after the single memory array. In another embodiment, at least two memory arrays containing a respective $M_t \times N$ array of memory cells may be formed such that the sum of all $M_t$'s equals M with at least two redundancy memory cell regions containing a respective $R_s \times N$ arrays of replacement memory cells and such that the sum of all values for $R_s$ over the index s ranging from 0 to T is equal to R. In such an embodiment, the at least two redundancy memory cell regions may be formed after each of the at least two memory arrays. In another embodiment, at least two memory arrays containing a respective $M_t \times N$ array of memory cells such that the sum of all $M_t$'s equals M with at least two redundancy memory cell regions containing a respective $R_s \times N$ arrays of replacement memory cells such that the sum of all values for $R_s$ over the index s ranging from 0 to T is equal to R. In such an embodiment, the at least two redundancy memory cell regions may be formed before and after each of the at least two memory arrays.

Figure 8:
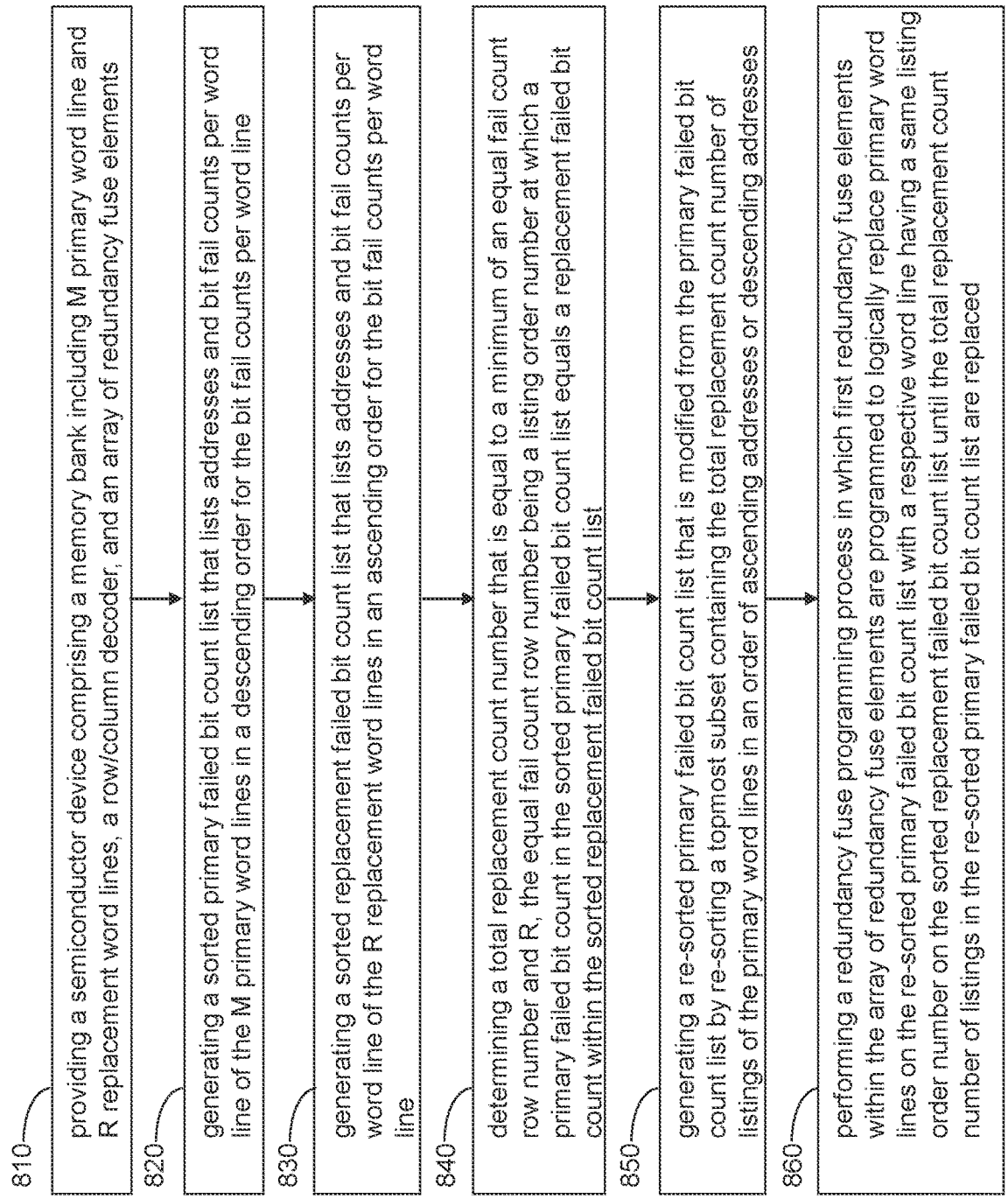
FIG. 8 is a second flowchart that illustrates a second exemplary sequence of processing steps for manufacturing a random access memory die of the present disclosure.

FIG. 8 is a second flowchart that illustrates a first exemplary sequence of processing steps for manufacturing a random access memory die of the present disclosure.

Referring collectively to FIGS. 1-4, 6, and 7 and step 810 of FIG. 8, a method of manufacturing a random access memory device may comprise the step of providing a semiconductor device comprising a memory bank including M primary word line and R replacement word lines, a row/column decoder, and an array of redundancy fuse elements.

Referring collectively to FIGS. 1-4, 6, and 7 and step 820 of FIG. 8 and FIG. 9, the method may comprise the step of generating a sorted primary failed bit count list that tabulates addresses and bit fail counts per word line of the M primary word lines in a descending order for the bit fail counts per word line. The same processing steps may be employed as in step 520 of FIG. 5.

Referring collectively to FIGS. 1-4, 6, and 7 and step 830 of FIG. 8 and FIG. 9, the method may comprise the step of generating a sorted replacement failed bit count list that tabulates addresses and bit fail counts per word line of the R replacement word lines in an ascending order for the bit fail count per word line. The same processing steps may be employed as in step 530 of FIG. 5.

Referring collectively to FIGS. 1-4, 6, and 7 and step 840 of FIG. 8, the method may comprise the step of determining a total replacement count number that is equal to a minimum of an equal fail count row number and R. The replacement count number is the listing order number (i.e., the row number) up to which a replacement process is to be subsequently performed within the sorted primary failed bit count list. In other words, a subsequent replacement operation on the failed primary word lines on the top portion of the sorted primary failed bit count list terminates at the listing order number that is equal to the replacement count number.

The equal fail count row number is a listing order number at which a primary failed bit count in the sorted primary failed bit count list equals a replacement failed bit count within the sorted replacement failed bit count list, i.e., the listing order number (or a row number in a table) that equals threshold number for bit fail count per word line. In this embodiment, replacement of any failed primary word line having a listing order number (i.e., the row number in the list) that is equal to, or greater than, the equal fail count row number with a respective replacement word line having the same listing order number is futile because the respective replacement word line has the same number of failed memory bits or has a greater number of failed memory bits.

Referring collectively to FIGS. 1-4, 6, and 7 and step 850 of FIG. 8 and FIG. 9, the method may comprise the step of generating a re-sorted primary failed bit count list that is modified from the primary failed bit count list by re-sorting a topmost subset containing the total replacement count number of listings of the primary word lines in an order of ascending addresses or descending addresses. In other words, only the primary word line addresses of the defective primary word lines to be subsequently logically replaced with replacement word lines are sorted in the order of ascending addresses or descending addresses.

According to an aspect of the present disclosure, the re-sorting algorithm may select between the order of ascending addresses and the order of descending addresses such that the physical routing distances (i.e., physical distances of the metal interconnect structures for transmitting electrical signals) may be minimized after logically replacing the defective primary word lines with the replacement word lines.

In one embodiment, a re-sorted replacement failed bit count list may be generated, which is modified from the replacement failed bit count list by re-sorting a topmost subset containing the total replacement count number of listings of the replacement word lines in an order of ascending addresses or descending addresses. In other words, only the replacement word line addresses of the defective primary word lines to subsequently logically replace the defective primary word lines are sorted in the order of ascending addresses or descending addresses. If the re-sorted primary failed bit count list is sorted in the order of ascending word line addresses, the re-sorted replacement failed bit count list is sorted in the order of ascending word line addresses. If the re-sorted primary failed bit count list is sorted in the order of descending word line addresses, the re-sorted replacement failed bit count list is sorted in the order of descending word line addresses.

Referring collectively to FIGS. 1-4, 6, and 7 and step 860 of FIG. 8, the method may comprise the step of performing a redundancy fuse programming process in which first redundancy fuse elements within the array of redundancy fuse elements are programmed to logically replace primary word lines on the re-sorted primary failed bit count list with a respective word line having a same listing order number on the sorted replacement failed bit count list until the total replacement count number of listings in the re-sorted primary failed bit count list are replaced. The methods employed at step 540 of FIG. 5 may be employed at step 860 of FIG. 8.

In one embodiment, the primary word lines on the re-sorted primary failed bit count list are sequentially replaced, from top to bottom, with the respective word line having the same listing order number on the sorted replacement failed bit count list.

In one embodiment, the random access memory device comprises substitution memory cells located within a replacement memory bit array that is configured to be accessed individually by a respective pair of access lines. Second redundancy fuse elements within the array of redundancy fuse elements may be programmed such that programmed second redundancy fuse elements logically replace each failed memory bit that is located within the primary memory array region and connected to a respective primary word line that is not logically replaced with a respective replacement word line with a respective one of the substitution memory cells.

In one embodiment, addresses of a set of all replacement word lines that replace a respective one of the primary word lines strictly increases or strictly decreases from one side to another among the R replacement word lines.

Referring to all drawings and according to various embodiments of the present disclosure, a random access memory device is provided, which comprises: a memory bank comprising a primary memory array region and a redundancy memory array region, wherein the primary array region comprises M×N primary memory cells connected to M primary word lines and N bit lines, and the redundancy memory array region comprises R×N redundancy memory cells connected to R replacement word lines and the N bit lines; and first redundancy fuse elements that are configured to logically replace each primary word line within the primary array region which has more failed memory bits than a threshold number for bit fail count per word line with a respective one of the redundancy word line which has a respective bit fail count number that is not greater than the threshold number for bit fail count per word line, wherein the threshold number for bit fail count per word line is a positive integer. The random access memory device comprises at least one feature selected from: a first feature that each redundancy word line that does not replace any primary word line comprises a respective bit fail count number that is equal to, or greater than, the threshold number for bit fail count per word line; and a second feature that at least one primary word line has a respective non-zero bit fail count number that is the same as, or less than, the threshold number for bit fail count per word line and is not replaced with any of the redundancy word lines.

In one embodiment, the random access memory device comprises substitution memory cells located within a replacement memory bit array that is configured to be accessed individually by a respective pair of access lines; and second redundancy fuse elements configured to logically replace each failed memory bit that is located within the primary memory array region and connected to a respective primary word line that is not logically replaced with a respective replacement word line with a respective one of the substitution memory cells.

In one embodiment, each pair of access lines is configured to access only a single substitution memory cell among the substitution memory cells, and is electrically isolated from all other substitution memory cells. In one embodiment, the substitution memory cells comprises an array of static random access memory cells comprising a respective set of at least six field effect transistors.

In one embodiment, the random access memory device comprises a control circuit that is configured to: re-route data for each failed memory bit that is replaced with a respective one of the substitution memory cells to the respective one of the substitution memory cells during a programming operation; and to overwrite data for each failed memory bit that is replaced with a respective one of the substitution memory cells with data that is read from respective one of the substitution memory cells during a read operation.

In one embodiment, the random access memory device comprises at least one feature that is selected from: a feature that addresses of a set of all replacement word lines that replace a respective one of the primary word lines strictly increases or strictly decreases from one side to another within the R×N redundancy memory cells; and a feature that the R×N redundancy memory cells may include at least two redundancy memory cell regions that are laterally spaced apart from each other or among one another by at least a subset of the M×N primary memory cells.

The various embodiments of the present disclosure may be employed to repair a random access memory die having a high bit error rate (BER), i.e., the probability of a functional failure for any given memory cell configured to store a single bit. In an illustrative comparative exemplary repair scheme, if a memory array area includes 1,024 primary word lines and 4,096 bit lines, if a redundancy cell area includes 64 replacement word lines and the same number of bit lines, and if the bit error rate is 100 parts per million (i.e., 0.0001), a replacement scheme that employs only fully functional replacement word lines (i.e., only replacement word lines that are not connected to any failed memory bit) provides an effective bit error rate of about 82 parts per million after a redundancy repair process that utilizes about 60% of all replacement word lines. In contrast, in an exemplary repair scheme employing embodiments of the present disclosure, if a memory array area includes 1,024 primary word lines and 4,096 bit lines, if a redundancy cell area includes 64 replacement word lines and the same number of bit lines, and if the bit error rate is 100 parts per million (i.e., 0.0001), a replacement scheme according to embodiments of the present disclosure may provide an effective bit error rate of about 78 parts per million after a redundancy repair process that utilizes about 90% of all replacement word lines. Upon utilization of the substitution memory cells, a yield close to 100% may be achieved (depending on the total number of substitution memory cells) according to embodiments of the present disclosure.

In another illustrative comparative exemplary repair scheme, if a memory array area includes 1,024 primary word lines and 4,096 bit lines, if a redundancy cell area includes 64 replacement word lines and the same number of bit lines, and if the bit error rate is 1,000 parts per million (i.e., 0.001), a replacement scheme that employs only fully functional replacement word lines (i.e., only replacement word lines that are not connected to any failed memory bit) provides an effective bit error rate of about 995 parts per million after a redundancy repair process that utilizes about 5% of all replacement word lines. The high bit error rate reduces the number of fully functional replacement word lines significantly, and thus, repair is ineffective. In contrast, in an exemplary repair scheme employing embodiments of the present disclosure, if a memory array area includes 1,024 primary word lines and 4,096 bit lines, if a redundancy cell area includes 64 replacement word lines and the same number of bit lines, and if the bit error rate is 1,000 parts per million (i.e., 0.001), a replacement scheme according to embodiments of the present disclosure may provide an effective bit error rate of about 940 parts per million after a redundancy repair process that utilizes about 90% of all replacement word lines. Upon utilization of the substitution memory cells, a much higher yield may be achieved (depending on the total number of substitution memory cells) according to embodiments of the present disclosure relative to the comparative exemplary repair scheme. Thus, embodiments of the present disclosure may provide a higher die yield after redundancy repair.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a random access memory device, comprising:
   providing a semiconductor device comprising a memory bank including M primary word lines and R replacement word lines, a row/column decoder, an array of redundancy fuse elements comprising first redundancy fuse elements, and substitution memory cells located within a replacement memory bit array that is configured to be accessed individually by a respective pair of access lines;
   generating a sorted primary failed bit count list that tabulates addresses and bit fail counts per word line of the M primary word lines;
   generating a sorted replacement failed bit count list that tabulates addresses and bit fail counts per word line of the R replacement word lines;
   programming the first redundancy fuse elements to logically replace primary word lines on the sorted primary failed bit count list with a respective word line having a same listing order number on the sorted replacement failed bit count list; and
   programming the second redundancy fuse elements to logically replace each failed memory bit that is located within a primary memory array region and connected to a respective primary word line that is not logically replaced with a respective replacement word line with a respective one of the substitution memory cells.

2. The method of claim 1, wherein:
   the sorted primary failed bit count list is generated in a descending order for the bit fail counts per word line; and
   the sorted replacement failed bit count list is generated in an ascending order for the bit fail count per word line.

3. The method of claim 2, wherein the first redundancy fuse elements are programmed until a primary failed bit count equals a replacement failed bit count or until all of the R replacement word lines are used up for replacement of R topmost primary word lines on the sorted primary failed bit count list.

4. The method of claim 1, wherein:
   at least one of the R replacement word lines has a respective bit fail count per word line that exceeds the threshold number for bit fail count per word line, and is not employed to logically replace any of the primary word lines; and
   replacement word line addresses of the logically replaced primary word lines, when listed from one end of the primary array region to another end of the primary array region for each of the logically replaced primary word lines, are listed in an order of ascending addresses of the replacement word lines that excludes an address of the at least one of the R replacement word lines, or in an order of descending addresses of the replacement word lines that excludes an address of the at least one of the R replacement word lines.

5. The method of claim 1, wherein the primary word lines on the sorted primary failed bit count list are sequentially replaced, from top to bottom, with the respective word line having the same listing order number on the sorted replacement failed bit count list.

6. The method of claim 1, wherein generating the sorted primary failed bit count list comprises:
   performing at least one write operation in which at least one test data pattern is written in a primary memory array region;
   performing at least one read operation in which the at least one test data pattern is read from the primary memory array region;
   determining a number of memory bit fails per each primary word line based on changes in the at least one test data pattern between the at least one read operation and the at least one write operation; and
   sorting addresses of the primary word lines such that associated numbers of memory bit fails per each primary word line is in a descending order.

7. The method of claim 6, wherein generating the sorted replacement failed bit count list comprises:

performing at least one write operation in which at least one test data pattern is written in a replacement memory array;

performing at least one read operation in which the at least one test data pattern is read from the replacement memory array;

determining a number of memory bit fails per each replacement word line based on changes in the at least one test data pattern between the at least one read operation and the at least one write operation; and sorting addresses of the replacement word lines such that associated numbers of memory bit fails per each replacement word line is in an ascending order.

8. The method of claim 1, wherein each pair of access lines is configured to access only a single substitution memory cell among the substitution memory cells, and is electrically isolated from all other substitution memory cells.

9. The method of claim 1, wherein the substitution memory cells comprises an array of static random access memory cells comprising a respective set of at least six field effect transistors.

10. The method of claim 1, wherein the second redundancy fuse elements are programmed such that:

a control circuit connected to the second redundancy fuse elements re-routes data for each failed memory bit that is replaced with a respective one of the substitution memory cells to the respective one of the substitution memory cells during a programming operation; and the control circuit overwrites data for each failed memory bit that is replaced with a respective one of the substitution memory cells with data that is read from respective one of the substitution memory cells during a read operation.

11. A method of manufacturing a random access memory device, comprising:

providing a semiconductor device comprising a memory bank including M primary word lines and R replacement word lines, and an array of redundancy fuse elements;

generating a sorted primary failed bit count list that tabulates addresses and bit fail counts per word line of the M primary word lines;

generating a sorted replacement failed bit count list that tabulates addresses and bit fail counts per word line of the R replacement word lines;

determining a total replacement count number that is equal to a minimum of an equal fail count row number and R, the equal fail count row number being a listing order number at which a primary failed bit count in the sorted primary failed bit count list equals a replacement failed bit count within the sorted replacement failed bit count list;

generating a re-sorted primary failed bit count list that is modified from the primary failed bit count list by re-sorting a topmost subset containing the total replacement count number of listings of the primary word lines in an order of ascending addresses or descending addresses; and programming first redundancy fuse elements within the array of redundancy fuse elements to logically replace primary word lines on the re-sorted primary failed bit count list with a respective word line having a same listing order number on the sorted replacement failed bit count list until the total replacement count number of listings in the re-sorted primary failed bit count list are replaced.

12. The method of claim 11, wherein:

the sorted primary failed bit count list is generated in a descending order for the bit fail counts per word line; and the sorted replacement failed bit count list is generated in an ascending order for the bit fail count per word line.

13. The method of claim 11, wherein the primary word lines on the re-sorted primary failed bit count list are sequentially replaced, from top to bottom, with the respective word line having the same listing order number on the sorted replacement failed bit count list.

14. The method of claim 11, wherein the random access memory device comprises substitution memory cells located within a replacement memory bit array that is configured to be accessed individually by a respective pair of access lines.

15. The method of claim 14, further comprising programming second redundancy fuse elements within the array of redundancy fuse elements such that programmed second redundancy fuse elements logically replace, with a respective one of the substitution memory cells, each failed memory bit that is located within a primary memory array region and connected to a respective primary word line that is not logically replaced with a respective replacement word line.

16. A random access memory device comprising:

a memory bank comprising a primary memory array region and a redundancy memory array region, wherein the primary array region comprises M×N primary memory cells connected to M primary word lines and N bit lines, and the redundancy memory array region comprises R×N redundancy memory cells connected to R replacement word lines and the N bit lines; and first redundancy fuse elements that are configured to logically replace each primary word line within the primary array region which has more failed memory bits than a threshold number for bit fail count per word line with a respective one of the replacement word lines which has a respective bit fail count number that is not greater than the threshold number for bit fail count per word line, wherein the threshold number for bit fail count per word line is a positive integer;

wherein at least one of the R replacement word lines has a respective bit fail count per word line that exceeds the threshold number for bit fail count per word line, and is not employed to logically replace any of the primary word lines; and wherein replacement word line addresses of the logically replaced primary word lines, when listed from one end of the primary array region to another end of the primary array region for each of the logically replaced primary word lines, are listed in an order of ascending addresses of the replacement word lines that excludes an address of the at least one of the R replacement word lines, or in an order of descending addresses of the replacement word lines that excludes an address of the at least one of the R replacement word lines.

17. The random access memory device of claim 16, wherein each replacement word line that does not replace any primary word line comprises a respective bit fail count number that is equal to, or greater than, the threshold number for bit fail count per word line.

18. The random access memory device of claim 16, wherein at least one primary word line has a respective non-zero bit fail count number that is the same as, or less than, the threshold number for bit fail count per word line and is not replaced with any of the replacement word lines.

19. The random access memory device of claim 16, further comprising:
   substitution memory cells located within a replacement memory bit array that is configured to be accessed individually by a respective pair of access lines; and
   second redundancy fuse elements configured to logically replace, with a respective one of the substitution memory cells, each failed memory bit that is located within the primary memory array region and connected to a respective primary word line that is not logically replaced with a respective replacement word line.

20. The random access memory device of claim 19, further comprising a control circuit that is configured to:
   re-route data for each failed memory bit that is replaced with a respective one of the substitution memory cells to the respective one of the substitution memory cells during a programming operation; and
   to overwrite data for each failed memory bit that is replaced with a respective one of the substitution memory cells with data that is read from respective one of the substitution memory cells during a read operation.

\* \* \* \* \*